United States Patent [19]
Caldwell et al.

[11] Patent Number: 5,023,572
[45] Date of Patent: Jun. 11, 1991

[54] VOLTAGE-CONTROLLED OSCILLATOR WITH RAPID TUNING LOOP AND METHOD FOR TUNING SAME

[75] Inventors: Stephen P. Caldwell, Columbia, Md.; David S. Korn, Washington, D.C.; Francis W. Hopwood, Severna Park, Md.

[73] Assignee: Westinghouse Electric Corp., Pittsburgh, Pa.

[21] Appl. No.: 453,742

[22] Filed: Dec. 20, 1989

[51] Int. Cl.$^5$ .......................................... H03L 7/085
[52] U.S. Cl. ...................................... 331/10; 331/16; 331/17; 331/25; 331/30
[58] Field of Search ................. 331/1 R, 1 A, 10, 16, 331/17, 25, 30, 32

[56] References Cited
U.S. PATENT DOCUMENTS

3,611,175 10/1971 Boelke .............................. 331/1 A
4,409,563 10/1983 Vandegraaf ...................... 331/17 X
4,426,627 1/1984 Yoshisato et al. ................ 331/17 X Primary Examiner—Siegfried H. Grimm
Attorney, Agent, or Firm—W. G. Sutcliff

[57] ABSTRACT

An oscillator circuit is coupled to receive first and second reference signals and includes a voltage-controlled oscillator for generating an oscillating signal. A difference frequency calculation circuit is coupled to the voltage-controlled oscillator to produce a count signal corresponding to a difference in frequency between the oscillating signal and the first reference signal. A feedback circuit is coupled to the difference frequency calculation circuit and coupled to receive the second reference signal which corresponds to a predetermined frequency for the oscillating signal. The feedback circuit provides a control signal as an input to the voltage-controlled oscillator to control the frequency of the oscillating signal. The method for tuning the voltage-controlled oscillator which generates the oscillating signal includes a step of calculating a difference in frequency between the oscillating signal and a first reference signal, and generating a count signal corresponding to the difference in frequency. The count signal is compared to a reference count signal corresponding to a predetermined frequency for the oscillating signal, and an error signal is generated based on the results of the comparison. The error signal and a prepositioning signal corresponding to the predetermined frequency for the oscillating signal are added to generate a control signal which is provided to the voltage-controlled oscillator to control the frequency of the oscillating signal.

19 Claims, 4 Drawing Sheets

VOLTAGE-CONTROLLED OSCILLATOR WITH RAPID TUNING LOOP AND METHOD FOR TUNING SAME

BACKGROUND OF THE INVENTION

This invention is directed to voltage controlled oscillators and a method for tuning such oscillators.

In the field of airborne radar systems, it is often desirable to employ pulse doppler radar which requires a high dynamic range. These types of radar systems are used in an airplane for the on-board detection of a target. Such systems require the use of a clutter oscillator to improve detection of a target from among a large number of false signals or "clutter" produced by the ground. New system mechanizations for ground moving target modes require very accurate clutter positioning to less than 5 Hz accuracy, while maintaining the capability for look-to-look offset switching. This required resolution is much higher than the 50 Hz resolution provided by currently available systems. Compounding this dramatically improved performance requirement is a reduction in the amount of system time available for calibration of the clutter positioning function, partly due to faster scan times for phased array antenna scanning.

Figure 1:
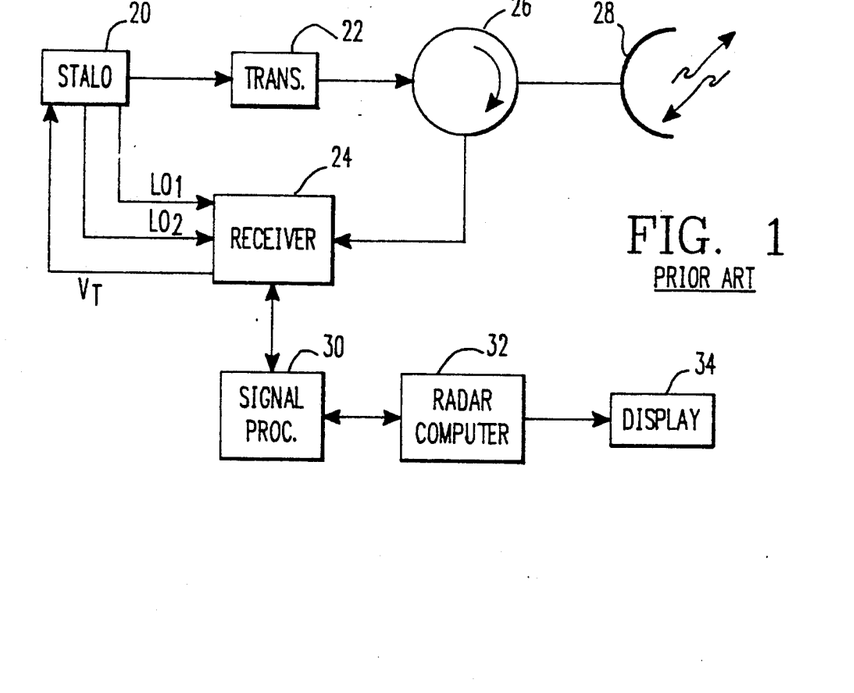
FIG. 1 is a block diagram of a prior art radar system including a stable local oscillator.

FIG. 1 is a block diagram of a typical prior art radar system which employs a calibrated/curve fitted voltage-controlled oscillator technique. The radar system of FIG. 1 includes a stable local oscillator (STALO) 20 for providing a transmit drive signal to a transmitter 22 and local oscillator signals $LO_1$ and $LO_2$ to a receiver 24. Based on the transmit drive signal, the transmitter 22 provides an output signal to a circulator 26 and then to an antenna 28. The receiver 24 receives incoming signals through the antenna 28 and the circulator 26. A digital signal processor 30 processes the received signals and provides an output signal to a general purpose radar computer 32 which is connected to a display 34. The digital signal processor 30 measures the frequency of the signal provided by the receiver 24 and determines whether a target or the ground has been detected.

Due to the requirements of the prior art radar system, it is necessary to calibrate an oscillator which is included in the STALO 20 by using the receiver 24 and the signal processor 30. The receiver 24 receives the local oscillator signals $LO_1$ and $LO_2$ from the STALO 20 and produces a tuning voltage $V_T$ to tune the oscillator in the STALO 20. The time required by the receiver 24 and the signal processor 30 to calculate and send the tuning voltage $V_T$ reduces the time available to the radar system for its primary function of finding targets. As a result, the resolution of currently available systems has been limited to 50 Hz.

If the prior art system described in FIG. 1 were to be modified to improve resolution to 5 Hz, this would require ever increasing calibration time and repetition rates to achieve such improved performance. In order to produce 5 Hz resolution using this type of system, it would require that one second of time be used as often as once every ten seconds to calibrate the oscillator in the STALO 20 as a result of variations in the oscillator output due to wide variations in temperature conditions. Since the use of such a large amount of time for calibration purposes takes away from the ability of the radar system to perform its primary function of detecting targets, there is a need in the art for an oscillator circuit having improved frequency resolution without requiring a large amount of calibration time.

The inventors of the subject application have considered the use of indirect frequency synthesis in order to provide frequency accuracy. Indirect frequency synthesis is an efficient means for generating many channels. However, frequency synthesis requires a phase-locked loop having a response time on the order of the reciprocal of the channel spacing. This precludes the use of a phase-locked loop in a fast switching application of the type required in advanced radar systems, where 5 Hz frequency channels must be locked up within at least approximately 500 microseconds. Specifically, the frequency synthesis approach takes approximately 30 milliseconds to lock up, whereas advanced radar systems preferably require lock up in 10 to 100 microseconds. Indirect frequency synthesis is also limited by sideband modulations at the channel spacing, particularly when used in STALOs which require 90 to 100 dB spurious. Thus, while the indirect frequency synthesis approach provides an improved oscillator, it is not practical for advanced radar systems because of the narrow loop bandwidth required in such systems.

In summary, there is a need in the art for an oscillator circuit which is capable of use in advanced high resolution radar systems. In particular, there is a need for an oscillator circuit capable of 5 Hz resolution within a relatively short lock up time, and for a method of tuning such an oscillator circuit.

SUMMARY OF THE INVENTION

It is an object of the present invention to provide an oscillator circuit which overcomes the above-described deficiencies of prior art oscillator circuits.

In particular, it is an object of the present invention to provide an oscillator circuit and tuning method which are capable of providing high resolution at a very fast lock up time.

The oscillator circuit of the present invention includes a voltage-controlled oscillator for generating an oscillating signal. A difference frequency calculation circuit is coupled to the voltage-controlled oscillator and produces a count signal corresponding to a difference in frequency between the oscillating signal and a first reference signal. A feedback circuit is coupled to the difference frequency calculation circuit and is coupled to receive a second reference signal which corresponds to a predetermined frequency for the oscillating signal. The feedback circuit provides a control signal as an input to the voltage-controlled oscillator to control the frequency of the oscillating signal.

The present invention is also directed to a method for tuning a voltage-controlled oscillator which generates an oscillating signal. In accordance with the method of the present invention, a difference in frequency between the oscillating signal and a first reference signal is calculated, and a count signal corresponding to the difference in frequency is generated. The count signal is compared to a reference count signal corresponding to a predetermined frequency of the oscillating signal, and an error signal is generated based on the results of the comparison. The error signal and a prepositioning signal corresponding to a predetermined frequency for the oscillating signal, are added to generate a control signal which is provided to the voltage-controlled oscillator to control the frequency of the oscillating signal.

In one embodiment, the voltage-controlled oscillator is a voltage-controlled crystal oscillator, and the oscillator circuit of the present invention is used in a stable local oscillator of a radar system.

The method and circuit of the present invention provide significant advantages in that they are capable of providing very high resolution and a very short lock up time. Thus, the method and circuit of the present invention are particularly suitable for use in advanced radar systems which require such improved resolution in combination with a short calibration time.

DETAILED DESCRIPTION OF THE PREFERRED EMBODIMENTS

Figure 2:
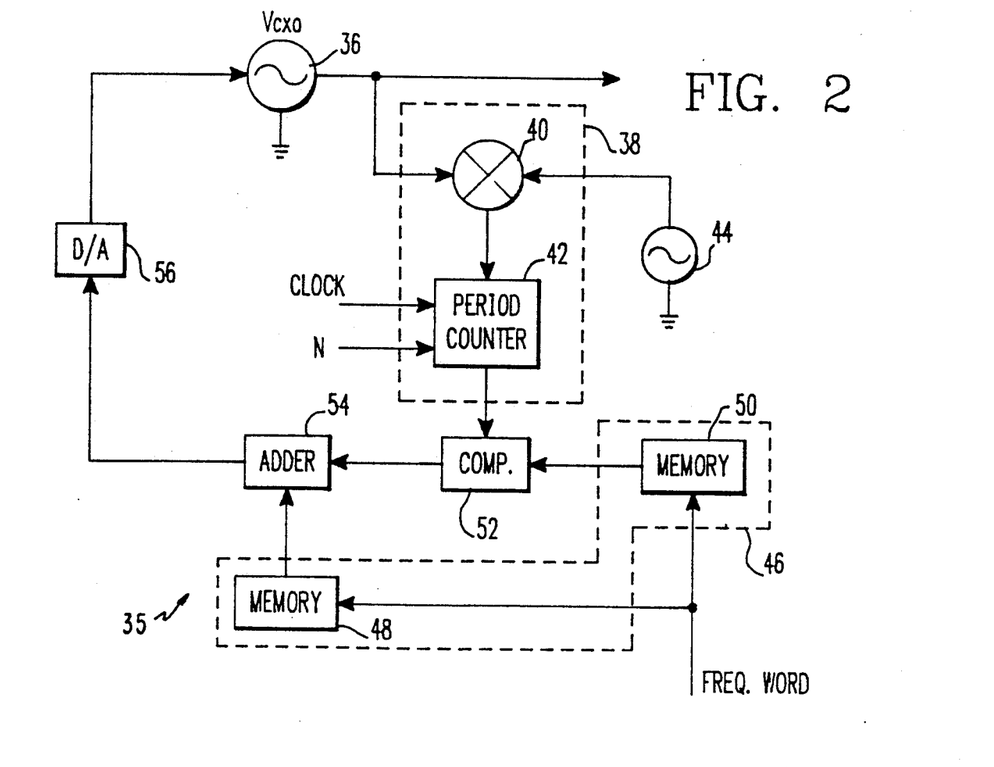
FIG. 2 is a block diagram of an improved oscillator circuit in accordance with the present invention.

FIG. 2 is a block diagram of an oscillator circuit 35 in accordance with the present invention which can be employed as an improved clutter oscillator in a stable local oscillator of a radar system. A voltage-controlled oscillator 36 produces an oscillating signal. In the preferred embodiment, the voltage-controlled oscillator 36 is a voltage-controlled crystal oscillator. The output of the voltage-controlled oscillator 36 is provided to a difference frequency calculation circuit 38 which includes a mixer 40 and a period counter 42. The mixer 40 receives a reference signal from an offset oscillator 44 which is set to have a frequency which is slightly different from that of the voltage-controlled oscillator 36, so that a difference frequency signal is produced by the mixer 40 for input to the period counter 42. The period counter 42 receives a clock signal and a signal identifying a number of measurements (N) and produces a count signal representing the number of clock pulses received during a measurement period. The period counter 42 provides a count of the number of clock pulses between zero crossings of the difference frequency signal and therefore measures the period of the difference frequency. The number N sets the number of cycles of the difference frequency signal (i.e., cycles of beat frequency) to be measured, and the measurement time is equal to $T_m$. The resolution of the circuit is determined by the clock rate of the clock input to the period counter 42. In order to lower the measurement time, there is a requirement for a higher beat frequency. However, this degrades the resolution which can in turn be improved by providing a higher clock rate.

A reference signal which is a frequency word input corresponding to a predetermined frequency of the voltage-controlled oscillator 36, is provided to a memory 46. In the preferred embodiment, the memory 46 is formed by a pair of memory circuits 48 and 50 which are programmable read-only memories (PROMs). Based on the frequency word input, the memory 50 provides, as an output, a reference count signal which is a digital word corresponding to the period of difference frequency for the predetermined frequency of the voltage-controlled oscillator 36. The other memory 48 outputs a reference prepositioning signal which is a digital word corresponding to the prepositioning voltage for the predetermined frequency of the voltage-controlled oscillator 36. A comparator 52 compares the count signal output by the period counter 42 to the reference count signal output by the memory 50 and generates an error signal based on the results of the comparison. An adding circuit 54 adds the error signal to the prepositioning signal to produce a digital feedback signal. A digital-to-analog converter 56 converts the digital feedback signal to a control signal which is an analog voltage for controlling the frequency of the voltage-controlled oscillator. The feedback circuitry illustrated in FIG. 2 is used to provide an oscillator circuit with improved tunability, without requiring that a tuning voltage be provided from an external source (e.g., the receiver 24 of prior art FIG. 1).

Figure 3:
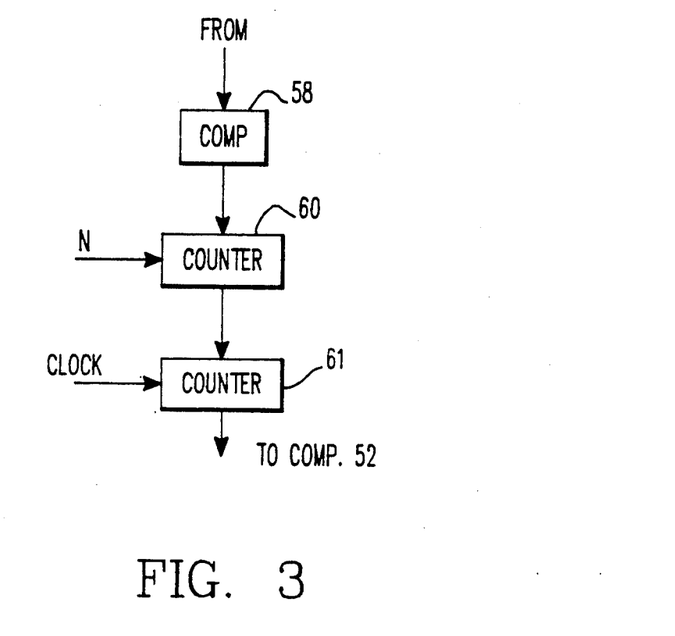
FIG. 3 is a block diagram of the period counter 42 of FIG. 2.

FIG. 3 is a block diagram of the period counter 42 of FIG. 2. The period counter 42 includes a comparator 58 for determining when the difference frequency has a zero crossing, and for providing an output signal indicating such a zero crossing. A counter 60 counts the number of zero crossings up to N times, in dependence upon the input number N applied to the counter 60, and outputs a reset signal after N zero crossings. A clock counter 61 counts the number of clock pulses produced until it is reset when the counter 60 has counted N zero crossings and produced the reset signal. The counter 61 outputs the count signal to the comparator 52.

While the period counter 42 illustrated in FIG. 3 discloses a counter for counting an integer number of cycles (N) of the difference frequency, it is only necessary that one cycle of difference frequency be considered, so that the counter 60 can be deleted if desired. In this case, the counter 61 will be reset at each zero crossing of the difference frequency signal as identified by the comparator 58. The implementation illustrated in FIG. 3 including the counter 60, provides increased resolution as a result of counting an integer number of cycles of the difference frequency.

Figure 4:
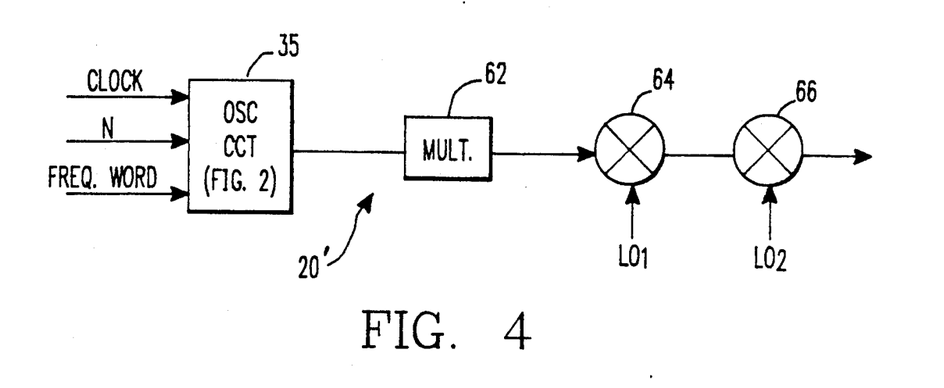
FIG. 4 is a block diagram of a stable local oscillator including the oscillator circuit of FIG. 2, which can be employed in place of the stable local oscillator to in the radar system of FIG. 1.

FIG. 4 is a block diagram of a stable local oscillator 20' which can replace the STALO 20 in the radar system of FIG. 1. The improved STALO 20' includes the oscillating circuit 35 of the present invention (illustrated in FIG. 2) which produces an oscillating signal within, for example, a frequency range of 20 MHz to 30 MHz. The oscillating signal is provided to a frequency multiplier 62 which multiplies additional tuning range. The output of the frequency multiplier 62 is a frequency multiplied oscillating signal $F_{LO3}+\Delta F$, where $F_{LO3}$ is the frequency of the voltage-controlled oscillator 36. By employing the oscillating circuit 35 of FIG. 2, the frequency multiplied output $F_{LO3}+\Delta F$ is stable and $\Delta F$ has improved resolution. The frequency multiplied output of multiplier 62 is provided to a frequency offset circuit 64 which in the preferred embodiment is a mixer for mixing the frequency multiplied oscillating signal by a local oscillating signal LOI, and for outputting a mixed signal. A frequency offset circuit 66 which is also a mixing circuit in the preferred embodiment, mixes the mixed signal with a local oscillating signal LO2 to produce the transmit signal which may be input to, for example, the transmitter 22 of the radar system of FIG. 1.

In accordance with the method of the present invention, an oscillating signal is generated and a difference signal corresponding to the difference in frequency between the oscillating signal and an offset oscillating signal is determined. The number of zero crossings of the difference signal is counted and a count signal corresponding to the counted number is generated. The count signal is compared to a reference count signal corresponding to a predetermined or desired frequency for the oscillating signal, and an error signal is generated based on results of the comparison. The error signal and a prepositioning signal corresponding to the predetermined frequency for the oscillating signal, are added to produce a digital feedback signal. The digital feedback signal is converted to an analog control signal which is applied to the voltage-controlled oscillator to control the frequency of the oscillating signal.

As indicated above, the present invention produces significant advantages in that it provides improved resolution while requiring only a small amount of calibration time. In particular, in accordance with the present invention, the frequency measurement resolution can be determined as follows:

$$Fres = \frac{Fbeat^2 * M}{Fclock * N} \quad (1)$$

where Fbeat is the difference frequency output by the mixer 40 and Fclock is the frequency of the high speed clock. In addition, M is the frequency multiplication factor of the multiplier 62 and N is the number of beat frequency cycles measured. The measurement time Tm can be determined as follows:

$$Tm = \frac{N}{Fbeat} \quad (2)$$

The number of clock cycles Ncount can be determined as follows:

$$Ncount = \frac{N * Fclock}{Fbeat}$$

As an example, if M=1 and N=1 and a beat frequency of 20 kHz is sampled with a 160 MHz clock, then the frequency resolution of the period counter 42, as determined by using the above equation, is 2.5 Hz. This is obtained over a measurement time of 50 microseconds.

Figure 5:
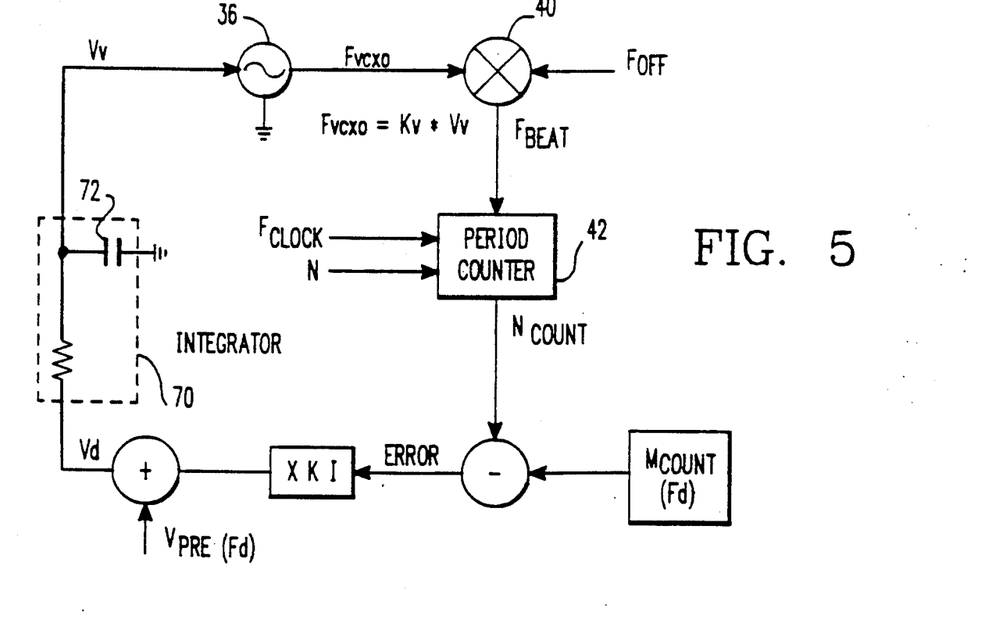
FIG. 5 illustrates the arrangement of an equivalent circuit to the oscillating circuit of the present invention, which was used for purposes of computer simulation.

A transient simulation of the circuit of the present invention was obtained by inputting into a computer an equivalent circuit for the feedback loop of the oscillating circuit 35, as illustrated in FIG. 5. In this simulation, the voltage-controlled oscillator 36 is modeled as a linear voltage versus frequency device with tuning sensitivity $K_v$ and tuning input time constant $\tau$. The time constant $\tau$ is modeled as an RC circuit 70, and the initial frequency of the voltage-controlled oscillator 36 is set by the initial voltage on a capacitor 72 in the RC circuit 70. The output of the voltage-controlled oscillator is mixed with an offset frequency $F_{off}$ by the mixer 40 which down converts the voltage-controlled oscillator frequency to a beat frequency Fbeat. The period of this beat frequency is counted by the period counter 42 which accumulates counts of the clock signal having frequency Fclock until the beat frequency has completed one cycle (i.e., $2\pi$ radians). Then, the count of the period counter 42 is compared to a reference beat note count (Mcount ($F_d$)). $F_d$ is the desired frequency of the voltage-controlled oscillator 36 which, for a given offset frequency $F_{off}$ determines the precise value of Mcount. The difference between the beat note count and the reference count is the error count which is multiplied by a loop gain constant K1 and fed back to the voltage-controlled oscillator 36. A preposition voltage $V_{pre}$ for the desired frequency $F_d$ is applied to the voltage-controlled oscillator 36 at the start of the transient analysis to reduce settling time. This is simulated by summing the voltage $V_{pre}$ with the multiplied error signal.

Figure 6:
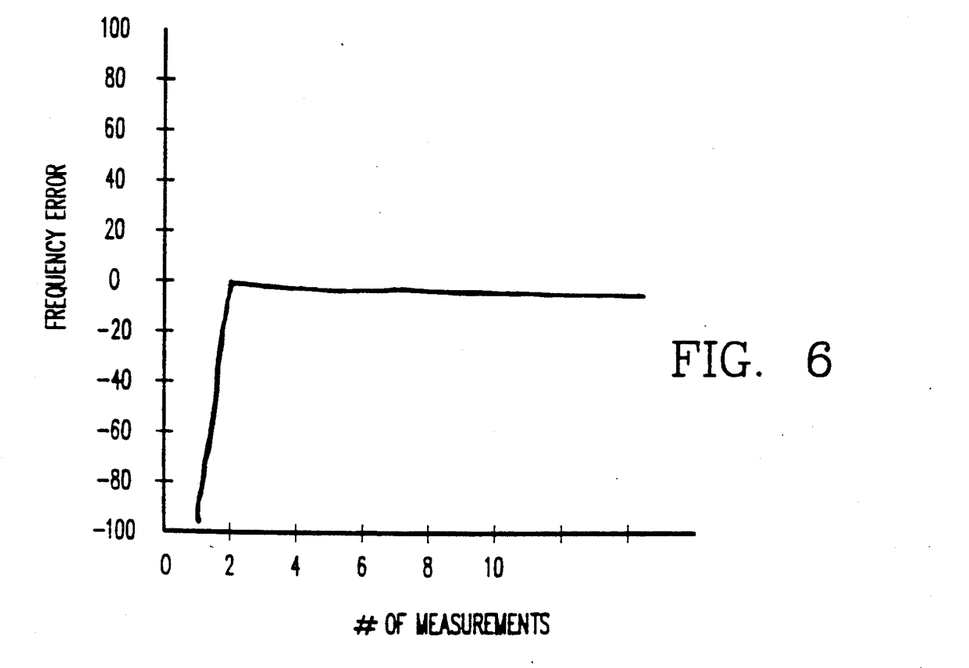
FIG. 6 is a graph of the ideal loop frequency error response generated by the computer simulation.
Figure 7:
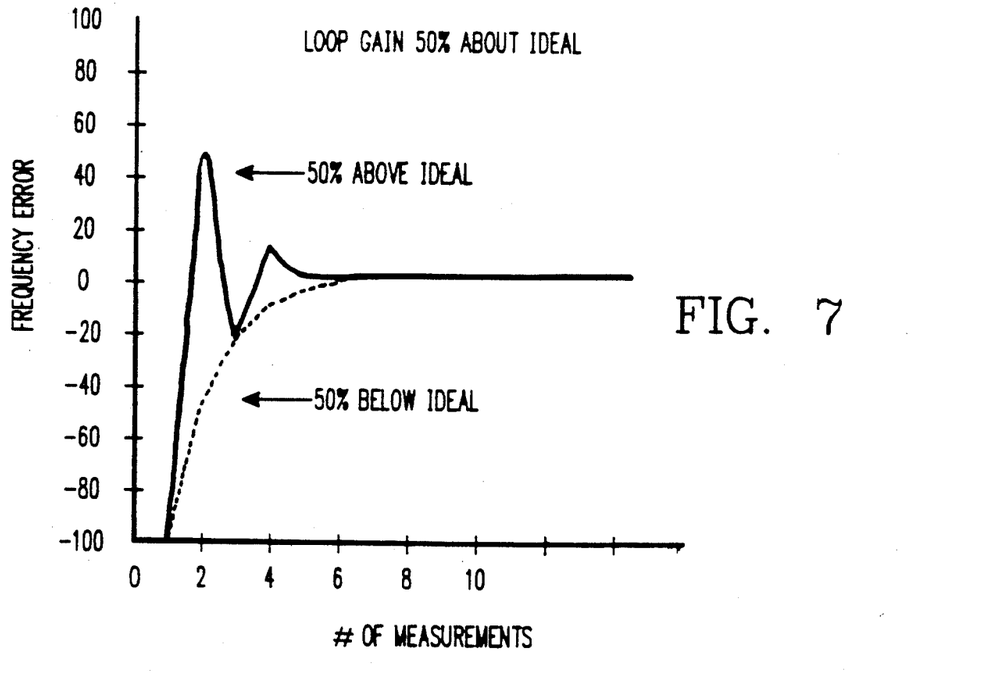
FIG. 7 is a graph of the effective loop gain on settling time, as generated by the computer simulation.

The results of the above-described computer simulation have shown the effects of loop gain and oscillator input time constant on settling times. FIG. 6 is a graph illustrating the ideal acquisition behavior for the feedback loop. In this case, the feedback is equal to the initial frequency error, so that the error is settled after one frequency measurement. Variation in loop gain will cause settling time to increase since the error fed back will not be equal to the initial error. FIG. 7 is a graph illustrating the settling time for loop gains which are ±50% of the ideal.

Figure 8:
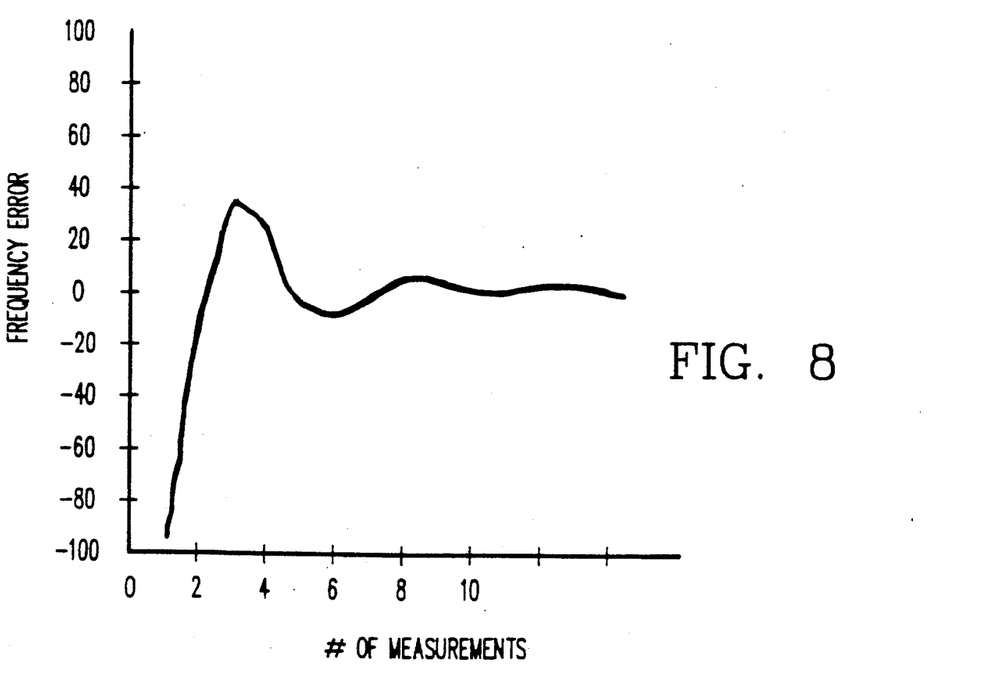
FIG. 8 is a graph showing the effect of the time constant of the voltage-controlled oscillator on settling time, as generated by the computer simulation.

Another source of increased settling time is the time constant associated with the voltage-controlled oscillator changing frequency. The time constant causes varying frequency during the period measurement which results in an erroneous value for the beat frequency. FIG. 8 shows the effects of the time constant on settling time for a time constant ($\tau$) of 30 microseconds.

The oscillating circuit 35 of the present invention may be implemented in numerous ways. For example, while the voltage-controlled oscillator 36 is described as a voltage-controlled crystal oscillator, other types of voltage-controlled oscillators may be employed. Further, while in the preferred embodiment memories 48 and 50 are used to provide the reference count and the reference prepositioning signal, any suitable apparatus for inputting this type of information to the feedback loop may be employed. For example, other types of memories may be employed, as well as direct operator input of these values. Further, the feedback loop of the oscillating circuit 35 of FIG. 2 can be implemented by a processor which can perform the necessary functions for the method of the present invention.

The method and circuit of the present invention provide improved resolution in a short period of time. Further, when the oscillating circuit of the present invention is used in a stable local oscillator of an advanced radar system, the other portions of the radar system do not have to spend time performing a calibration function, so that there is more time available to search for targets. Further, the improved frequency resolution provided by the method and circuit of the present invention is produced without degrading the phase noise and spurious in radar implementations.

The method and circuit of the present invention is particularly suited for STALO mechanizations of the type illustrated in FIG. 4 where clutter positioning is added to the transmit signal. Since the clutter oscillator's output is used only during transmit time, the remaining time until the next pulse generation is available for the feedback loop to position the clutter oscillator.

The oscillator is only tuned look-to-look to avoid modulation of the oscillator frequency during this time.

The many features and advantages of the invention are apparent from the detailed specification and thus it is intended by the appended claims to cover all such features and advantages of the system which fall within the true spirit and scope of the invention. Further, since numerous modifications and changes will occur to those skilled in the art, it is not desired to limit the invention to the exact construction and operation shown and described, and accordingly, all suitable modifications and equivalents may be resorted to, falling within the scope of the invention.

What is claimed is:

1. An oscillator circuit coupled to receive first and second reference signals, comprising:
    a voltage-controlled oscillator for generating an oscillating signal;
    first means for producing a digital count signal corresponding to a difference in frequency between the oscillating signal and the first reference signal; and
    second means for comparing the digital count signal and the second reference signal which is a digital signal corresponding to a predetermined frequency for the oscillating signal, and generating a digital error signal, and for converting the digital error signal to a control signal which is input to said voltage-controlled oscillator to control the frequency of the oscillating signal.

2. An oscillator circuit according to claim 1, wherein said second means comprises:
    a memory, coupled to receive the second reference signal, for outputting a reference count signal corresponding to the second reference signal and a reference prepositioning signal corresponding to the second reference signal;
    a first comparator, coupled to said memory and said first means, for comparing the digital count signal and the reference count signal, and for outputting the digital error signal based on the results of the comparison;
    an adder, coupled to said memory and said first comparator, for adding the prepositioning signal to the digital error signal to produce a feedback signal; and
    a digital-to-analog converter, coupled to said adder, for converting the feedback signal to the control signal which is provided to the voltage-controlled oscillator.

3. An oscillator circuit according to claim 2, wherein said first means comprises:
    a mixing circuit coupled to said voltage-controlled oscillator and coupled to receive the first reference signal, for producing a difference frequency signal; and
    a period counter, coupled to said mixing circuit and said first comparator, and coupled to receive a clock signal, for producing the digital count signal based on the difference frequency signal and the clock signal.

4. An oscillator circuit according to claim 3, wherein said period counter comprises:
    a second comparator, coupled to said mixing circuit, for producing a zero crossing signal indicating the zero crossings of the difference frequency signal;
    a first counter, coupled to said second comparator, for producing a reset signal for every N zero crossings of the difference frequency signal, where N is an integer greater than or equal to 1; and
    a second counter, coupled to said first counter and coupled to receive the clock signal, for producing the digital count signal when the reset signal is received from said first counter.

5. An oscillator circuit according to claim 3, wherein said period counter comprises:
    a second comparator, coupled to said mixing circuit, for producing a zero crossing signal indicating the zero crossings of the difference frequency signal; and
    a counter, coupled to said first and second comparators, for producing the digital count signal each time the zero crossing signal is produced by said second comparator.

6. An oscillator circuit according to claim 1, wherein said first means comprises:
    a mixing circuit coupled to said voltage-controlled oscillator and coupled to receive the first reference signal, for producing a difference frequency signal; and
    a period counter, coupled to said mixing circuit and said second means, and coupled to receive a clock signal, for producing the digital count signal based on the difference frequency signal and the clock signal.

7. An oscillator circuit according to claim 6, wherein said period counter comprises:
    a comparator, coupled to said mixing circuit, for producing a zero crossing signal indicating the zero crossings of the difference frequency signal;
    a first counter, coupled to said comparator, for producing a reset signal for every N zero crossings of the difference frequency signal, where N is an integer greater than or equal to 1; and
    a second counter, coupled to salad first counter and coupled to receive the clock signal, for producing the digital count signal when the reset signal is received from said first counter.

8. An oscillator circuit according to claim 6, wherein said period counter comprises:
    a comparator, coupled to said mixing circuit, for producing a zero crossing signal indicating the zero crossings of the difference frequency signal; and
    a counter, coupled to said comparator and said second means, for producing the digital count signal each time the zero crossing signal is produced by said comparator.

9. A stable local oscillator for use in a radar system coupled to receive first and second reference signals and first and second local oscillating signals, comprising:
    a voltage-controlled oscillator for generating an oscillating signal;
    first means for producing a count signal corresponding to a difference in frequency between the oscillating signal and the first reference signal;
    second means for receiving the count signal and the second reference signal which corresponds to a predetermined frequency for the oscillating signal, and for providing a control signal as an input to said voltage-controlled oscillator to control the frequency of the oscillating signal;
    a multiplier, coupled to said voltage-controlled oscillator, for multiplying the oscillating signal by a predetermined factor, to produce a frequency multiplied oscillating signal; and frequency offset means, coupled to said multiplier and coupled to receive the first and second local oscillating signals, for generating a transmit signal for said radar system based on the frequency multiplied oscillating signal and the first and second local oscillating signals.

10. A stable local oscillator according to claim 9, wherein said second means comprises:
 a memory, coupled to receive the second reference signal, for outputting a reference count signal corresponding to the second reference signal and a reference prepositioning signal corresponding to the second reference signal;
 a first comparator, coupled to said memory and said first means, for comparing the count signal and the reference count signal and for outputting an error signal based on the results of the comparison;
 an adder, coupled to said memory and said first comparator, for adding the prepositioning signal to the error signal to produce a feedback signal; and
 a digital-to-analog converter, coupled to said adder, for converting the feedback signal to the control signal which is provided to the voltage-controlled oscillator.

11. A stable local oscillator according to claim 10, wherein said first means comprises:
 a mixing circuit coupled to said voltage-controlled oscillator and coupled to receive the first reference signal, for producing a difference frequency signal; and
 a period counter, coupled to said mixing circuit and said first comparator, and coupled to receive a clock signal, for producing the count signal based on the difference frequency signal and the clock signal.

12. An oscillator circuit according to claim 11, wherein said period counter comprises:
 a second comparator, coupled to said mixing circuit, for producing a zero crossing signal indicating the zero crossings of the difference frequency signal;
 a first counter, coupled to said comparator, for producing a reset signal for every N zero crossings of the difference frequency signal, where N is an integer greater than or equal to 1; and
 a second counter, coupled to said first counter and coupled to receive the clock signal, for producing the count signal when the reset signal is received from said first counter.

13. A stable local oscillator according to claim 12, wherein said frequency offset means comprises:
 a first frequency offset circuit, coupled to said multiplier and coupled to receive the first local oscillating signal, for mixing the frequency multiplied oscillating signal by the first local oscillating signal to produce a mixed signal; and
 a second frequency offset circuit, coupled to said first frequency offset circuit and coupled to receive the second local oscillating signal, for mixing the second local oscillating signal and the mixed signal to produce the transmit signal for said radar system.

14. An oscillator circuit coupled to receive first and second reference signals, comprising:
 a voltage-controlled oscillator for generating an oscillating signal;
 a difference frequency calculation circuit, coupled to said voltage-controlled oscillator, for producing a digital count signal corresponding to a difference in frequency between the oscillating signal and the first reference signal; and
 a feedback circuit, coupled to said difference frequency calculation circuit and coupled to receive the second reference signal which is a digital signal corresponding to a predetermined frequency for the oscillating signal, for comparing the digital count signal and the second reference signal and generating a digital error signal, and for converting the digital error signal to a control signal which is input to said voltage-controlled oscillator to control the frequency of the oscillating signal.

15. An oscillator circuit according to claim 14, wherein said feedback circuit comprises:
 a memory, coupled to receive the second reference signal, for outputting a reference count signal and a reference prepositioning signal corresponding to the second reference signal;
 a comparator, coupled to said memory and said difference frequency calculation circuit, for comparing the digital count signal and the reference count signal and for outputting the digital error signal based on the results of the comparison;
 an adder, coupled to said memory and said comparator, for adding the prepositioning signal to the digital error signal to produce a feedback signal; and
 a digital-to-analog converter, coupled to said adder, for converting the feedback signal to the control signal which is provided to said voltage-controlled oscillator.

16. An oscillator circuit according to claim 15, wherein said difference frequency calculation circuit comprises:
 a mixing circuit, coupled to said voltage-controlled oscillating and coupled to receive the first reference signal, for producing a difference frequency signal; and
 a period counter, coupled to said mixing circuit and said comparator, and coupled to receive a clock signal, for producing the digital count signal based on the difference frequency signal and the clock signal.

17. A method for tuning a voltage-controlled oscillator which generates an oscillating signal, comprising the steps of:
 (a) calculating a difference in frequency between the oscillating signal and a first reference signal, and generating a count signal corresponding to the difference in frequency;
 (b) comparing the count signal to a reference count signal corresponding to a predetermined frequency for the oscillating signal, and generating an error signal based on the results of the comparison;
 (c) adding the error signal and a prepositioning signal corresponding to a predetermined frequency for the oscillating signal, to generate a control signal which is provided to the voltage-controlled oscillator to control the frequency of the oscillating signal.

18. A method according to claim 17, wherein said step (c) comprises the substeps of:
 (c1) adding the error signal and a prepositioning signal corresponding to a predetermined frequency for the oscillating signal, to generate a digital feedback signal; and
 (c2) converting the digital feedback signal to an analog signal which is the control signal.

19. A method according to claim 18, wherein said step (a) comprises the substeps of:

(a1) generating a frequency difference signal based on the difference in frequency between the oscillating signal and the first reference signal;

(a2) generating a zero crossing signal each time the frequency difference signal has a zero crossing; and (a3) counting the number of clock pulses of a clock signal received between zero crossings of the frequency difference signal and outputting the count signal based on the counted clock pulses.

* * * * *